US009965669B2

(12) United States Patent
Yamamoto

(10) Patent No.: US 9,965,669 B2
(45) Date of Patent: May 8, 2018

(54) OPTICAL DEVICE

(71) Applicant: SEIKO EPSON CORPORATION, Tokyo (JP)

(72) Inventor: Gakuji Yamamoto, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days. days.

(21) Appl. No.: 15/383,123

(22) Filed: Dec. 19, 2016

(65) Prior Publication Data

US 2017/0103248 A1 Apr. 13, 2017

Related U.S. Application Data

(63) Continuation of application No. 14/582,599, filed on Dec. 24, 2014, now Pat. No. 9,559,239.

(30) Foreign Application Priority Data

Dec. 27, 2013 (JP) ................. 2013-270764

(51) Int. Cl.
| | | |
|---|---|---|
| *H01J 40/14* | (2006.01) | |
| *G06K 9/00* | (2006.01) | |
| *H01L 27/146* | (2006.01) | |
| *H01L 27/32* | (2006.01) | |
| *H04N 5/225* | (2006.01) | |

(52) U.S. Cl.
CPC ....... *G06K 9/0004* (2013.01); *G06K 9/00087* (2013.01); *H01L 27/1462* (2013.01); *H01L 27/14623* (2013.01); *H01L 27/14627* (2013.01); *H01L 27/14649* (2013.01); *H01L 27/3234* (2013.01); *H04N 5/2254* (2013.01)

(58) Field of Classification Search
CPC ............ H01L 27/146; H01L 27/14625; H05B 33/0896
USPC ....... 250/221, 216, 214.1; 345/173, 175, 176
See application file for complete search history.

(56) References Cited

U.S. PATENT DOCUMENTS

| | | | |
|---|---|---|---|
| 7,348,946 B2 | 3/2008 | Booth, Jr. et al. | |
| 2004/0263670 A1 | 12/2004 | Yamasaki | |
| 2012/0256089 A1* | 10/2012 | Kanda ................. | G06K 9/0004 250/338.1 |
| 2016/0058339 A1* | 3/2016 | Eguchi ............... | A61B 5/14546 600/322 |
| 2016/0163747 A1 | 6/2016 | Koide | |
| 2016/0163761 A1 | 6/2016 | Kudo | |

FOREIGN PATENT DOCUMENTS

| | | | | |
|---|---|---|---|---|
| JP | 2000-354132 A | 12/2000 | | |
| JP | 2004-311046 A | 11/2004 | | |
| JP | 2005-010407 A | 1/2005 | | |
| JP | 2005-539247 A | 12/2005 | | |
| JP | 2008067727 A | * | 3/2008 | ............ A61B 5/117 |
| JP | 2009-172263 A | 8/2009 | | |
| JP | 2010-243539 A | 10/2010 | | |

(Continued)

*Primary Examiner* — Kevin Pyo

(57) ABSTRACT

An optical device includes a first substrate, a second substrate, a first transmitting portion, N light-emitting portions, and a light-receiving portion. The first transmitting portion is disposed in the first substrate. The N light-emitting portions are disposed in the first substrate, and the N is an integer of 2 or more. The light-receiving portion is configured to receive light passing through the first transmitting portion and is disposed in the second substrate.

7 Claims, 6 Drawing Sheets

(56) References Cited

FOREIGN PATENT DOCUMENTS

| | | |
|---|---|---|
| JP | 2011-018507 A | 1/2011 |
| JP | 2011-249541 A | 12/2011 |
| JP | 2012-222484 A | 11/2012 |
| WO | 03/058588 A2 | 7/2003 |

* cited by examiner

OPTICAL DEVICE

CROSS-REFERENCE TO RELATED APPLICATIONS

This application is a continuation application of U.S. patent application Ser. No. 14/582,599, filed on Dec. 24, 2014. This application claims priority to Japanese Patent Application No. 2013-270764 filed on Dec. 27, 2013. The entire disclosures of U.S. patent application Ser. No. 14/582,599 and Japanese Patent Application No. 2013-270764 are expressly incorporated by reference herein.

BACKGROUND

1. Technical Field

The present invention relates to the field of optical devices.

2. Related Art

In recent years, some biometric devices and image scanners have a light-emitting portion and a light-receiving portion that are disposed on the same side with respect to a subject (e.g., a part of a living body, an original, and the like) placed on a reading area and read an image of the subject by irradiating the subject with light from the light-emitting portion and receiving the reflected light with the light-receiving portion. For example, JP-A-2009-172263 discloses a biological information acquisition device that captures a vein image of the finger by irradiating the finger with light (near-infrared light) emitted from a light source using a plurality of reflecting surfaces formed on a rear surface of a light guide plate, and receiving light reflected from the finger with a light receiving element having a plurality of pixels.

However, there is a problem with the biological information acquisition device disclosed in JP-A-2009-172263 in that it is difficult to capture a sharp image. That is to say, the emitted light (noise light) that may possibly have a larger light quantity than the reflected light (signal light), from which information should be read, is introduced into the light receiving element, resulting in a decrease in the ratio of the signal light to the noise light (S/N ratio). The reasons for this are that the light guide plate that guides the emitted light from the light source, which has a larger light quantity than the reflected light, is present on optical paths (on straight lines extending from the respective pixels in a vertical direction) of the reflected light incident on the pixels, and that a part of the emitted light from the light source is transmitted through a low refractive index layer and a reflective layer (semi-reflective layer) that are formed on the rear surface side of the light guide plate and leaks to the side of the light receiving element. Consequently, there is a problem in that the light receiving element cannot accurately receive the reflected light from the finger.

SUMMARY

An advantage of some aspects of the invention is to solve at least a part of the problems described above, and the invention can be implemented in the following forms or application examples.

According to one aspect of the invention, an optical device includes a first substrate, a second substrate, a first transmitting portion, N light-emitting portions, and a light-receiving portion. The first transmitting portion is disposed in the first substrate. The N light-emitting portions are disposed in the first substrate, and the N is an integer of 2 or more. The light-receiving portion is configured to receive light passing through the first transmitting portion and is disposed in the second substrate.

According to the aspect of the invention, a wavelength of light that is emitted from at least one light-emitting portion among the N light-emitting portions is different from a wavelength of light that is emitted from a different light-emitting portion that is different from the at least one light-emitting portion among the N light-emitting portions.

According to the aspect of the invention, a wavelength of light that is emitted from at least one light-emitting portion among the N light-emitting portions is greater than or equal to 750 nm and smaller than or equal to 3000 nm.

According to the aspect of the invention, wavelengths of light emitted from the N light-emitting portions are different from each other.

According to the aspect of the invention, the N light-emitting portions are disposed around the first transmitting portion.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
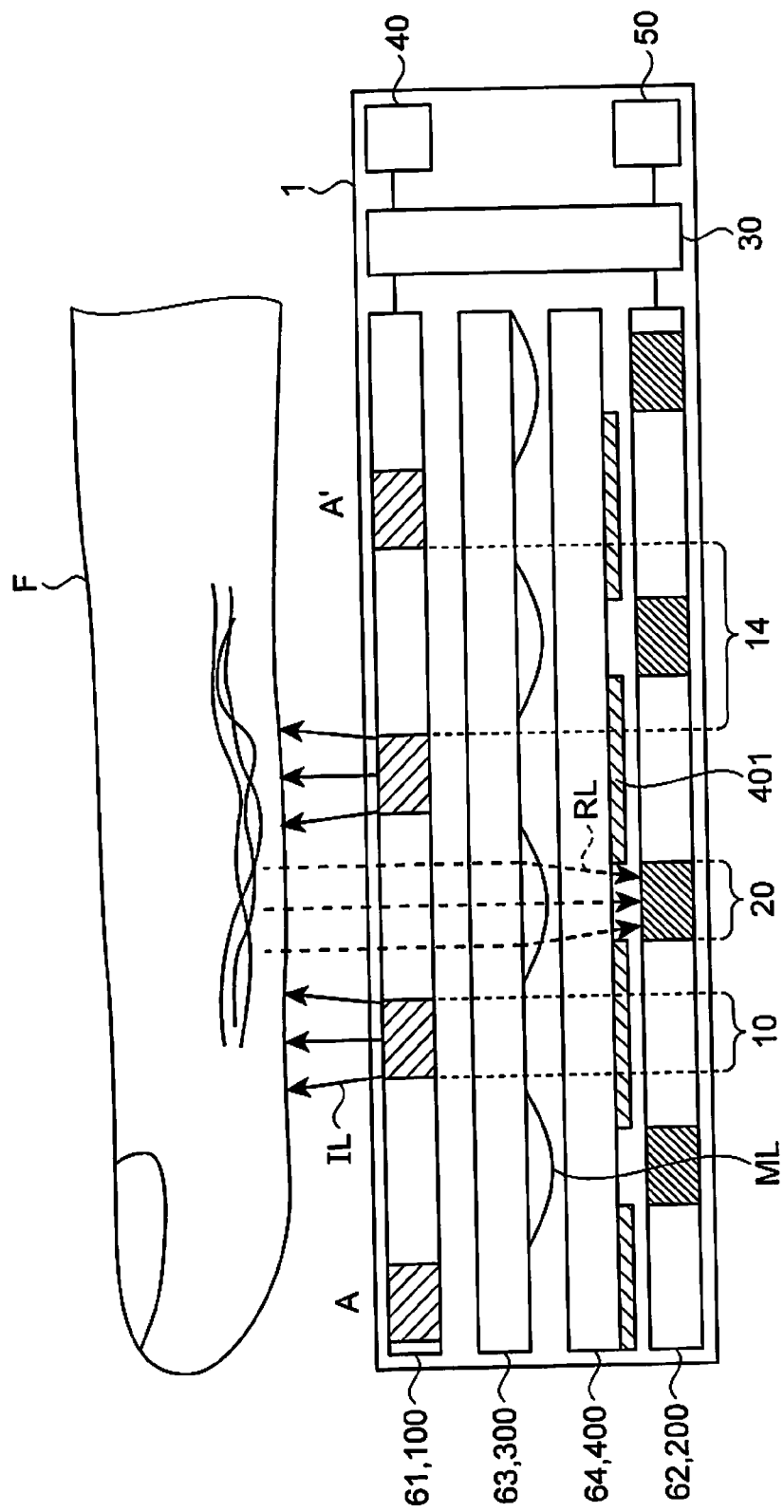
FIG. 1 is a cross-sectional view of an optical device according to Embodiment 1.

The following describes embodiments of the invention with reference to the drawings. In the drawings referred to below, in order to show layers and members in recognizable sizes, scales of the layers and the members are set different from actual scales. Also, "pitch" as used herein means a spatial interval of certain objects or shapes when the certain objects or shapes are spatially repeatedly arranged.

Embodiment 1

Overview of Optical Device

First, an overview of an optical device 1 will be described with reference to FIG. 1.

Figure 2:
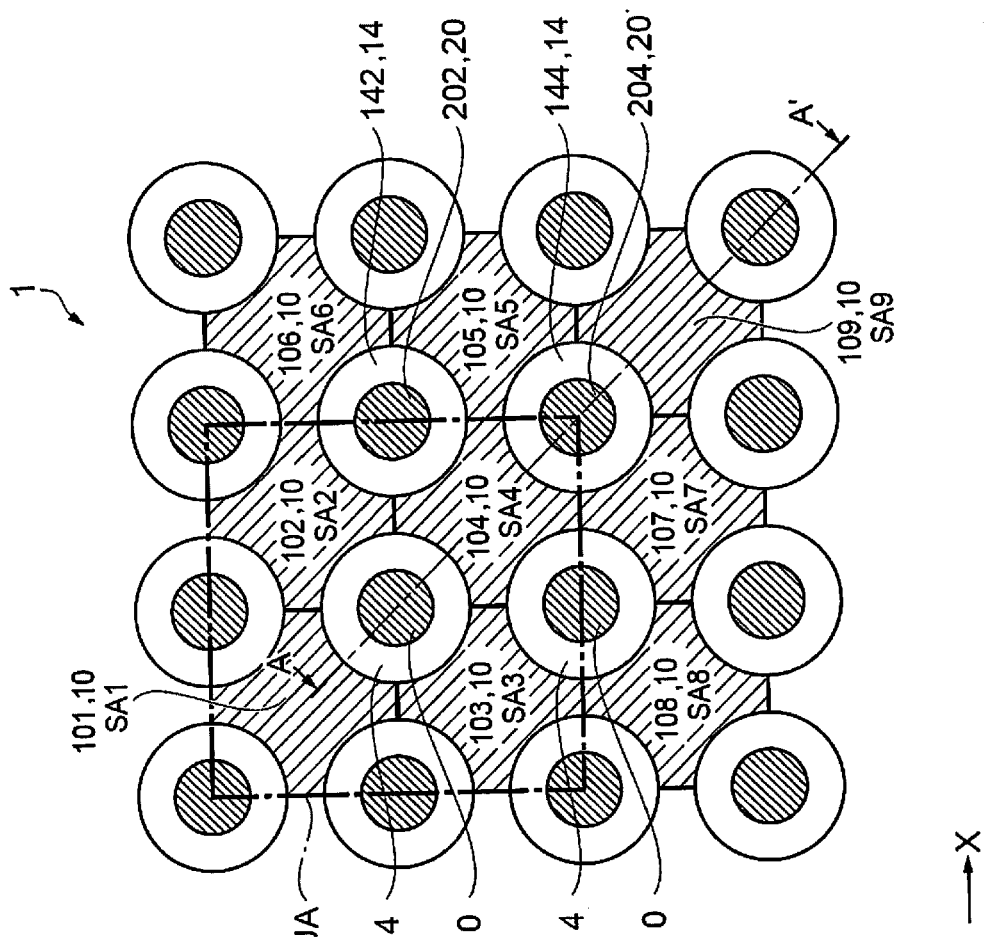
FIG. 2 is a diagram illustrating a planar configuration of the optical device.

FIG. 1 is a cross-sectional view of an optical device according to this embodiment. In FIG. 1, a cross section taken along line A-A' in a plan view shown in FIG. 2 is schematically shown by way of example. The optical device 1 includes light-emitting portions 10 and light-receiving portions 20, and irradiates a subject F such as the finger with irradiation light IL from the light-emitting portions 10 and receives reflected light RL from the subject F with the light-receiving portions 20. The light-emitting portions 10 and the light-receiving portions 20 are provided on the same side with respect to the subject F, and the light-emitting portions 10 are located closer to the subject F than the light-receiving portions 20 are. That is to say, the light-emitting portions 10 are located between the subject F such as the finger and the light-receiving portions 20. The light-emitting portions 10 are formed in an illumination device 100 and provided closer to the surface side (the surface on which the subject F is placed) of the optical device 1 than the light-receiving portions 20 are. In the case where such an arrangement is used, the illumination device 100 may be referred to as a front light. The illumination device 100 is provided with a plurality of light-emitting portions 10, and portions between the plurality of light-emitting portions 10 individually serve as light-transmitting portions 14. For this reason, the illumination device 100 may also be formed in a substrate having translucency. The transmitting portions 14 transmit the reflected light RL from the subject F. Therefore, when the light-emitting portions 10 are emitting light, the reflected light RL is transmitted through the transmitting portions 14 and reaches the light-receiving portions 20 as shown in FIG. 1. The light-receiving portions 20 are formed in a measurement device 200. In this embodiment, the illumination device 100 is formed in a first substrate 61, and the measurement device 200 is formed in a second substrate 62 that is different from the first substrate 61. Each light-receiving portion 20 formed in the second substrate 62 is provided with an optical sensor that measures the light quantity of the reflected light RL. The optical sensor converts the received light into an electric signal corresponding to the light quantity of the received light.

If the illumination device 100 having the light-emitting portions 10 is formed in the first substrate 61 and the measurement device 200 having the light-receiving portions 20 is formed in the second substrate 62 as shown in this embodiment, the manufacturing process is facilitated. Furthermore, a non-defective illumination device 100 and a non-defective measurement device 200 can be combined with each other, and thus the yield is also improved.

In addition to the light-emitting portions 10 and the light-receiving portions 20, the optical device 1 includes a control portion 30, a storage portion 40, and an output portion 50. The storage portion 40 includes a nonvolatile memory such as a flash memory and a hard disk and stores various programs, such as an image forming program and an authentication program, and authentication information (e.g., a vein image that is registered in advance, feature point information thereof, or the like in the case where the optical device 1 is used as a vein sensor). The storage portion 40 may also include a read-only memory (ROM), and a part or all of the aforementioned programs and various types of information may also be stored in the ROM. The control portion 30 includes a central processing unit (CPU) and a temporary storage. The temporary storage may be a dynamic random access memory (DRAM), a static random access memory (SRAM), or the like and temporarily stores a captured image and the like of the subject F. A device that temporarily stores an image as described above may also be referred to as a video random access memory (VRAM). The control portion 30 controls the turning on and off of light emission of the light-emitting portions 10, and also reads light reception signals from the optical sensors included in the light-receiving portions 20 and generates an image of the subject F based on the read light reception signals corresponding to a single frame (corresponding to an imaging area). The control portion 30 can also perform biometric authentication by analyzing the captured image and making a comparison against the authentication information registered in the storage portion 40. For example, in the case where the optical device 1 is used as a vein sensor, the control portion 30 makes a comparison of feature point information (e.g., the number of bifurcations, the positional relationship, and the like of veins) between two vein images (the captured vein image and the registered vein image) to be compared with each other. If the degree of similarity is equal to or more than a predetermined threshold value, the finger, which is the subject F, is authenticated as the finger that is registered in the storage portion 40. The output portion 50 is a portion that outputs the authentication information and the captured image to the outside, and performs the outputting in various forms in which, for example, the authentication information is output to an external device (ATM etc.) as electric signals or the image is displayed on a display portion. It should be noted that the VRAM that is provided in the temporary storage of the control portion 30 may also be provided in a part of the nonvolatile memory.

The optical device 1 may further include a light controlling device 300 and a filter device 400. The light controlling device 300 includes microlenses ML that are formed in a third substrate 63, and the microlenses ML are formed at positions corresponding to the respective transmitting portions 14 of the first substrate 61. The filter device 400 is formed in a fourth substrate 64, and the surface of the fourth substrate 64 excluding positions (apertures) corresponding to the respective light-receiving portions 20 of the second substrate 62 is covered with a light-shielding film 401. The microlenses ML are formed so as to guide the reflected light RL to the apertures. The provision of the light controlling device 300 and the filter device 400 in the optical device 1 suppresses introduction of noise light other than the reflected light RL into the light-receiving portions 20 and thus improves the S/N ratio.

With regard to the first substrate 61, the third substrate 63, and the fourth substrate 64, a material exhibiting high translucency with respect to the irradiation light IL and the reflected light RL may be used. Examples of such a material include transparent glass and transparent plastic. With regard to the second substrate 62, a material that is suitable for formation of the optical sensors is used. In this embodiment, the optical sensors are formed using a thin film element, and thus alkali-free glass and silica glass, which are suitable for formation of a thin film element, may be used. Alternatively, it is possible to use a semiconductor substrate such as a silicon substrate and form the optical sensors using a semiconductor element.

Planar Configuration of Optical Device

Next, a planar configuration of the optical device 1 will be described with reference to FIG. 2.

FIG. 2 is a diagram illustrating the planar configuration of the optical device. As shown in FIG. 2, the optical device 1 has a unit area UA having a rectangular shape when viewed from above. In this embodiment, the unit area UA has a square shape, and the square unit area UA is repeatedly arranged in a first direction (X direction, horizontal direction) and a second direction (Y direction, vertical direction) that crosses the first direction, and thus forms the optical device 1. That is to say, in the optical device 1, the unit areas UA are arranged in an array when viewed from above.

A transmitting portion 14 (first transmitting portion 141) is disposed at the center of a certain unit area UA (referred to as a predetermined area) in the first substrate 61. In addition to this, the unit area UA includes transmitting portions 14 that have half the size of the first transmitting portion 141 and are disposed at the four sides, respectively, of the unit area UA, and transmitting portions 14 that have one-fourth the size of the first transmitting portion 141 and are disposed at the four corners, respectively, of the unit area UA. Accordingly, a single unit area UA includes the transmitting portions 14 that have a total of four times the size of the first transmitting portion 141. The unit area UA further includes N sub-areas in areas other than the transmitting portions 14. N is an integer of 2 or more. In this embodiment, one conceivable form in the case where N=4 is shown. The four sub-areas are disposed around the first transmitting portion 141 so as to have substantially equal areas. Specifically, as shown in FIG. 2, in the predetermined area, a first area SA1 (first sub-area), a second area SA2 (second sub-area), a third area SA3 (third sub-area), and a fourth area SA4 (fourth sub-area) are disposed around the first transmitting portion 141. The third area SA3 is symmetrical to the second area SA2 with respect to the first transmitting portion 141, and the fourth area SA4 is symmetrical to the first area SA1 with respect to the first transmitting portion 141.

Since the unit area UA is repeated in the X direction, a second transmitting portion 142 that is contiguous with the second area SA2 and the fourth area SA4 is further formed in the first substrate 61. In addition to the second area SA2 and the fourth area SA4, a fifth area SA5 and a sixth area SA6 that are symmetrical to the second area SA2 and the fourth area SA4, respectively, with respect to the second transmitting portion 142 are formed around the second transmitting portion 142. Similarly, since the unit area UA is repeated in the Y direction as well, a third transmitting portion 143 that is contiguous with the third area SA3 and the fourth area SA4 is further formed in the first substrate 61. In addition to the third area SA3 and the fourth area SA4, a seventh area SA7 and an eighth area SA8 that are symmetrical to the third area SA3 and the fourth area SA4, respectively, are formed around the third transmitting portion 143. Moreover, a fourth transmitting portion 144 that is contiguous with the fourth area SA4, the fifth area SA5, and the seventh area SA7 is also formed in the first substrate 61. In addition to the fourth area SA4, the fifth area SA5, and the seventh area SA7, a ninth area SA9 that is symmetrical to the fourth area SA4 is formed around the fourth transmitting portion 144.

The shape of the predetermined area (the unit area UA that includes the first transmitting portion 141) is defined by the transmitting portions 14, which have a total of four times the size of the first transmitting portion 141, the first area SA1, the second area SA2, the third area SA3, and the fourth area SA4. All of the sub-areas have the same shape when viewed from above, and furthermore, all of the transmitting portions 14 have the same shape when viewed from above. Thus, the shape of an area that is defined by the transmitting portions 14 that have a total of four times the size of the second transmitting portion 142, the second area SA2, the fourth area SA4, the fifth area SA5, and the sixth area SA6 is the same as the shape of the predetermined area. Similarly, the shape of an area that is defined by the transmitting portions 14 that have a total of four times the size of the third transmitting portion 143, the third area SA3, the fourth area SA4, the seventh area SA7, and the eighth area SA8 is the same as the shape of the predetermined area. Furthermore, the shape of an area that is defined by the transmitting portions 14 that have a total of four times the size of the fourth transmitting portion 144, the fourth area SA4, the fifth area SA5, the seventh area SA7, and the ninth area SA9 is the same as the shape of the predetermined area.

A light-receiving portion 20 is formed at approximately the center of each transmitting portion 14, the light-receiving portion 20 receiving light passing through that transmitting portion 14. That is to say, the first substrate 61 and the second substrate 62 are fixed so that light passing through the transmitting portions 14 is guided to the corresponding light-receiving portions 20, and the light-receiving portions 20 are disposed in areas overlapping the corresponding transmitting portions 14 when the first substrate 61 is viewed from above. For example, a first light-receiving portion 201 that receives light passing through the first transmitting portion 141 is formed overlapping the first transmitting portion 141, a second light-receiving portion 202 that receives light passing through the second transmitting portion 142 is formed overlapping the second transmitting portion 142, a third light-receiving portion 203 that receives light passing through the third transmitting portion 143 is formed overlapping the third transmitting portion 143, and a fourth light-receiving portion 204 that receives light passing through the fourth transmitting portion 144 is formed overlapping the fourth transmitting portion 144. Since an optical sensor is disposed in each light-receiving portion 20, the optical sensors are arranged in an array when the optical device 1 is viewed from above. As shown in FIG. 1, a plurality of microlenses ML are provided on normal lines to the respective light-receiving portions 20 under the transmitting portions 14 (between the first substrate 61 and the second substrate 62) such that the plurality of microlenses ML are provided in an array so as to match the arrangement of the light-receiving portions 20. Thus, the pitch at which the microlenses ML are arrayed is equal to the pitch at which the light-receiving portions 20 are arrayed, and each microlens ML images the reflected light RL from the subject F onto a light-receiving surface of the corresponding light-receiving portion 20 that is located directly under that microlens ML.

A light-emitting portion 10 is provided in each of the N sub-areas within a single unit area UA of the illumination device 100. Accordingly, N light-emitting portions 10 are formed within a single unit area UA of the first substrate 61. For example, in the predetermined area of the illumination device 100, N light-emitting portions 10 are disposed around the first transmitting portion 141. In this embodiment, a first light-emitting portion 101 is disposed in the first area SA1 of the first substrate 61, a second light-emitting portion 102 is disposed in the second area SA2 on the first substrate 61, a third light-emitting portion 103 is disposed in the third area SA3 of the first substrate 61, and a fourth light-emitting portion 104 is disposed in the fourth area SA4 of the first substrate 61. Similarly, a fifth light-emitting portion 105 is disposed in the fifth area SA5 of the first substrate 61, a sixth light-emitting portion 106 is disposed in the sixth area SA6 of the first substrate 61, a seventh light-emitting portion 107 is disposed in the seventh area SA7 of the first substrate 61, an eighth light-emitting portion 108 is disposed in the eighth area SA8 of the first substrate 61, and a ninth light-emitting portion 109 is disposed in the ninth area SA9 of the first substrate 61. Each light-emitting portion 10 emits the irradiation light IL at a wavelength that is suited to the subject F to be imaged. For example, when the subject F to be imaged is the veins of the finger, the irradiation light IL is near-infrared light whose wavelength is in the range of 750 nm to 3000 nm (more preferably, 800 nm to 900 nm). Reduced hemoglobin flowing through the veins has a property of absorbing near-infrared light. Therefore, if the finger is imaged using near-infrared light, a subcutaneous vein portion of the finger is imaged more darkly than the surrounding tissues, and a pattern that is produced by this difference in brightness is imaged as a vein image.

A control circuit (see FIG. 3) is included in each unit area UA of the illumination device 100, the control circuit controlling light emission of the N light-emitting portions 10 that are present in that unit area UA. The control circuit is functionally divided into N control portions, namely, first to N-th control portions, and the N control portions are individually disposed in areas in the first substrate 61 that overlap the N light-emitting portions 10, respectively, when viewed from above. In this embodiment, since N=4, the control circuit has a first control portion, a second control portion, a third control portion, and a fourth control portion. In a state in which the first substrate 61 is viewed from above, the first control portion is disposed at a position overlapping the first area SA1, the second control portion is disposed at a position overlapping the second area SA2, the third control portion is disposed at a position overlapping the third area SA3, and the fourth control portion is disposed at a position overlapping the fourth area SA4. Moreover, a fifth control portion having a function equivalent to that of the third control portion is disposed at a position overlapping the fifth area SA5. Similarly, a sixth control portion having a function equivalent to that of the first control portion is disposed at a position overlapping the sixth area SA6. Also, a seventh control portion having a function equivalent to that of the second control portion is disposed at a position overlapping the seventh area SA7. An eighth control portion having a function equivalent to that of the first control portion is disposed at a position overlapping the eighth area SA8. Furthermore, a ninth control portion having a function equivalent to that of the first control portion is disposed at a position overlapping the ninth area SA9. Consequently, each unit area UA includes transmitting portions 14 that have a total of four times the size of a single transmitting portion 14, four light-emitting portions 10, and a control circuit that controls these four light-emitting portions 10, the control circuit being functionally divided into four control portions, the control portions overlapping the respective light-emitting portions 10.

Since the illumination device 100 performs the same operations (such as causing any portion to emit light) as those of known existing organic EL display devices, the size of the control circuit in the unit area UA is substantially equal to that of a pixel circuit of an organic EL display device. On the other hand, in the illumination device 100, which has excellent translucency, since it is necessary to arrange the light-emitting portions 10 and the transmitting portions 14 side by side in the same substrate, it is not possible to use a large proportion of the surface of the first substrate 61 for the light-emitting portions 10. Furthermore, since the human eye can recognize an object of 100 microns (μm) or more, it is not preferable to simply increase the area of the light-emitting portions 10 or the transmitting portions 14 and arrange those portions. The reason for this is that if the light-emitting portions 10 have a large area, these portions inhibit the translucency, while if the transmitting portions 14 have a large area, these portions look like missing pixels. In short, it is required that the arrangement of the control circuit be fitted within an area that is substantially equal to the area of a pixel circuit of an existing organic EL display device.

Thus, in this embodiment, the area of the unit area UA is set within a range of 40000 square microns (μm$^2$) (about 200 microns (μm)×200 microns (μm)) to 250000 square microns (μm$^2$) (about 500 microns (μm)×500 microns (μm)), with about 50 percent or more of that area being used for the transmitting portions 14 and the remainder being used for the light-emitting portions 10. Furthermore, the N light-emitting portions 10 are caused to emit light by a single control circuit that is divided into N portions. The larger the proportion (referred to as "aperture ratio") of the area of the transmitting portions 14, the larger the amount of light that is allowed to enter, and thus the more the translucency of the illumination device 100 improves. This is preferable for a front light. Preferably, the area of a single light-emitting portion 10 is not more than 10000 square microns (μm$^2$) (about 100 microns (μm)×100 microns (μm)) in view of the visibility of the eye. Accordingly, the total area of the light-emitting portions 10 in the unit area UA is preferably not more than 40000 square microns (μm$^2$). Moreover, for example, if the unit area UA has a square shape of about 500 microns (μm)×500 microns (μm) (the unit area UA has an area of about 250000 square microns (μm$^2$)), it is preferable to set the area of a single light-emitting portion 10 at about 10000 square microns (μm$^2$) (about 100 microns (μm)×100 microns (μm)) and the total area of the light-emitting portions 10 in the unit area UA to be not more than 40000 square microns (μm$^2$), and use the remainder, about 210000 square microns (μm$^2$) or more, for the light-transmitting portions.

In this embodiment, the size of the unit area UA is set at 200 microns (μm)×200 microns (μm), with about 50 percent of the unit area UA being used for the transmitting portions 14 and the remainder, about 50 percent, being used for the light-emitting portions 10. In this manner, the pitch at which the transmitting portions 14 are arranged and the pitch at which the light-emitting portions 10 are arranged can be set at 100 microns (μm). Thus, the illumination device 100 functions as a front light while maintaining a state in which the transmitting portions do not look like missing pixels. Moreover, it is unnecessary to reduce the size of transistors and a storage capacitor SC (see FIG. 3) constituting the control circuit, and thus it is possible to design in accordance with an ordinary layout rule. As described above, the illumination device 100 serves as a front light that performs the operations equivalent to those of an organic EL display device, and when, as shown in this embodiment, the illumination device 100 is attached to the measurement device 200 that detects light, it is possible to first grasp an overall picture, then cause light to be emitted locally from only a necessary portion, and thereby obtain more detailed information. This is because only necessary information can be obtained with pinpoint accuracy by suppressing the noise light incident on the measurement device 200.

Circuit Configuration of Illumination Device

Next, a circuit configuration in the unit area UA of the illumination device 100 will be described with reference to FIG. 3.

Figure 3:
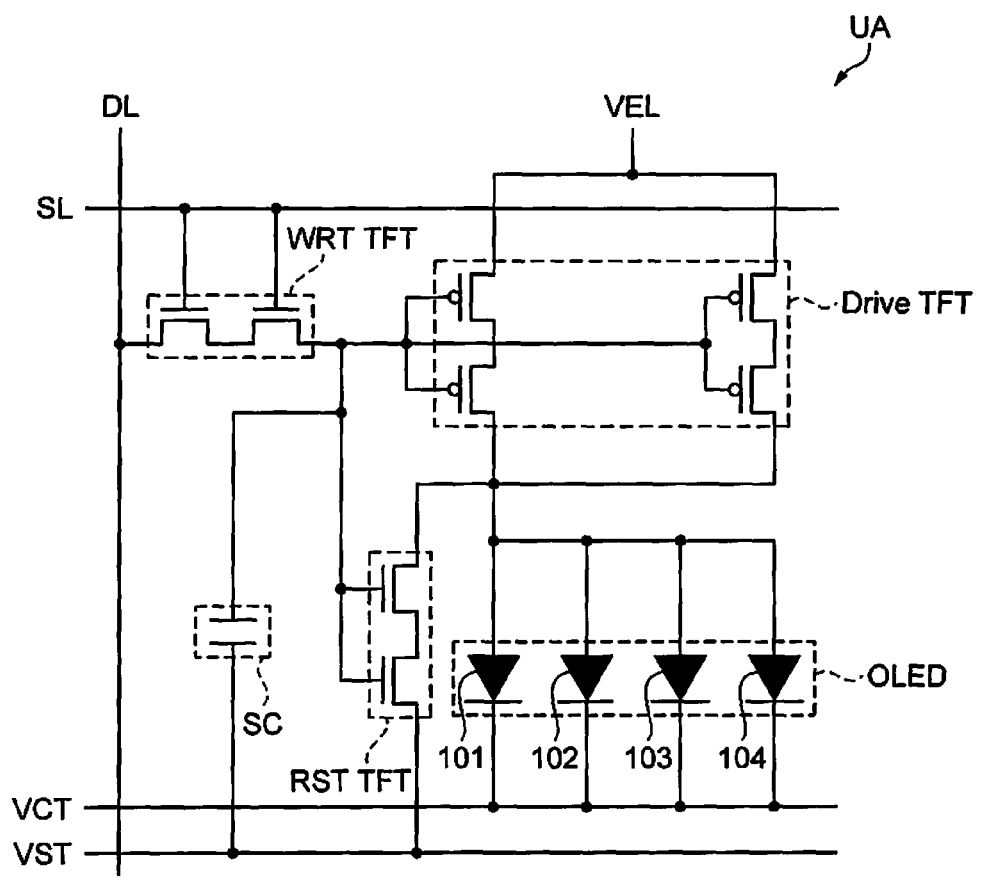
FIG. 3 is a diagram illustrating a circuit configuration in a unit area of an illumination device.

FIG. 3 is a diagram illustrating the circuit configuration in the unit area of the illumination device. In FIG. 3, by way of example, the predetermined area, which includes the first light-emitting portion 101, the second light-emitting portion 102, the third light-emitting portion 103, and the fourth light-emitting portion 104, is shown as the unit area UA.

A scan line SL and a data line DL are routed in each unit area UA, and the unit area UA is formed at an intersection of these lines. Furthermore, an anode power supply line VEL, a cathode power supply line VCT, and a fixed potential line VST are routed in each unit area UA. A control circuit is formed in each unit area UA. The control circuit includes a write transistor WRT TFT, a storage capacitor SC, a drive transistor Drive TFT, a reset transistor RST TFT, and an organic EL element OLED. In this embodiment, the write transistor WRT TFT and the reset transistor RST TFT are N-type thin film transistors, and the drive transistor Drive TFT is a P-type thin film transistor.

The first control portion, the second control portion, the third control portion, and the fourth control portion that constitute the control circuit have different functions, and each of the first light-emitting portion 101, the second light-emitting portion 102, the third light-emitting portion 103, and the fourth light-emitting portion 104 is controlled by the control circuit. In a specific example, the first control portion of the control circuit includes a part of the drive transistor Drive TFT, and the second control portion of the control circuit includes the storage capacitor SC. Furthermore, the third control portion of the control circuit includes the other part of the drive transistor Drive TFT and the reset transistor RST TFT. A part of the drive transistor Drive TFT is formed in the first control portion, and the other part thereof is formed in the third control portion. The fourth control portion of the control circuit includes the write transistor WRT TFT. The organic EL element OLED constitutes the first light-emitting portion 101, the second light-emitting portion 102, the third light-emitting portion 103, and the fourth light-emitting portion 104. As shown in FIG. 3, even if the control circuit has a complicated configuration, the control circuit can be configured within the unit area UA (predetermined area) by functionally dividing the control circuit into the four control portions.

The gate of the write transistor WRT TFT is electrically connected to the scan line SL, while one of the source and the drain thereof is electrically connected to the data line DL and the other is electrically connected to one of the electrodes of the storage capacitor SC, the gate of the drive transistor Drive TFT, and the gate of the reset transistor RST TFT. The other electrode of the storage capacitor SC is electrically connected to the fixed potential line VST. One of the source and the drain of the drive transistor Drive TFT (in this embodiment, the source of the P-type thin film transistor) is electrically connected to the anode power supply line VEL, and the other is electrically connected to the anode of the organic EL element OLED and one of the source and the drain of the reset transistor RST TFT (in this embodiment, the drain of the N-type thin film transistor). The other of the source and the drain of the reset transistor RST TFT (in this embodiment, the source of the N-type thin film transistor) is electrically connected to the fixed potential line VST. The cathode of the organic EL element OLED is electrically connected to the cathode power supply line VCT. Dual transistors in which transistors are electrically connected in series are used for the write transistor WRT TFT, the reset transistor RST TFT, and the drive transistor Drive TFT in order to suppress the leakage current from the transistors. Furthermore, in the drive transistor Drive TFT, dual transistors are arranged in parallel in order to secure a certain amount of current.

The write transistor WRT TFT writes data when selected, and therefore the fourth control portion has a function of rewriting data when selected. The storage capacitor SC maintains written data, and therefore the second control portion has a function of maintaining data. The drive transistor Drive TFT supplies an electric current to the organic EL element OLED when data indicates "light emission" (in this embodiment, when data is a low potential signal) and interrupts the electric current to the organic EL element OLED when data indicates "non-light emission" (in this embodiment, when data is a high potential signal). On the other hand, the reset transistor RST TFT disconnects the anode of the organic EL element OLED from the fixed potential line VST when data indicates "light emission" (in this embodiment, when data is a low potential signal) and resets the anode of the organic EL element OLED to the fixed potential when data indicates "non-light emission" (in this embodiment, when data is a high potential signal). Accordingly, the third control portion has a function of controlling light emission and non-light emission of the organic EL element OLED. The first control portion also has a function of controlling light emission and non-light emission of the organic EL element OLED.

The signal that is supplied to the data line DL is a high potential signal (e.g., 15 V) or a low potential signal (e.g., 0 V). Also, the anode potential that is supplied to the anode power supply line VEL is set at a value that is in the range of 10 V to 13 V and lower than the high potential signal, and is variable depending on the usage conditions. Setting the anode potential to be lower than the high potential signal of data makes it possible to reliably switch the drive transistor Drive TFT to an off state when data is the high potential signal and to reliably turn off the light emission of the organic EL element OLED. The fixed potential that is supplied to the fixed potential line VST is the same fixed potential as that of the low potential signal. The cathode potential that is supplied to the cathode power supply line VCT is set at a value that is in the range of −2 V to 0 V and lower than the low potential signal, and is variable depending on the usage conditions. Setting the cathode potential to be lower than the low potential signal makes it possible to reliably turn off the light emission of the organic EL element OLED when "non-light emission" is indicated.

In this manner, it is possible to cause light to be emitted from any location (unit area UA) of the illumination device 100 when viewed from above. Accordingly, it is possible to cause light to be emitted from only a location at which illumination is required while turning off light from the other locations, and thus the power consumption of the illumination device 100 can be suppressed. Furthermore, since one control circuit controls the N light-emitting portions 10, the area of the control circuit can be reduced when compared with a case where one control circuit controls one light-emitting portion 10, and consequently, the proportion of the area of the transmitting portions 14 can be increased. The increase in the area of the transmitting portions 14 improves the overall transparency of the illumination device 100, and thus the illumination device 100 can constitute a bright and high-visibility front light. Moreover, with regard to the optical device 1, it is possible to cause light to be emitted from any location of the optical device 1 when viewed from above. Accordingly, it is possible to cause light to be emitted from only an optimum location that is suitable for imaging while turning off light from the other locations, so that the optical device 1 can reduce the noise light and achieve a high S/N ratio. Furthermore, since one control circuit controls the N light-emitting portions 10, the area of the control circuit can be reduced when compared with a case where one control circuit controls one light-emitting portion 10, and consequently the proportion of the area of the transmitting portions 14 can be increased. The increase in the area of the transmitting portions 14 can improve the sensitivity of the optical device 1.

Cross-Sectional Structure of Illumination Device

Next, a cross-sectional structure of the illumination device 100 will be described with reference to FIG. 4.

Figure 4:
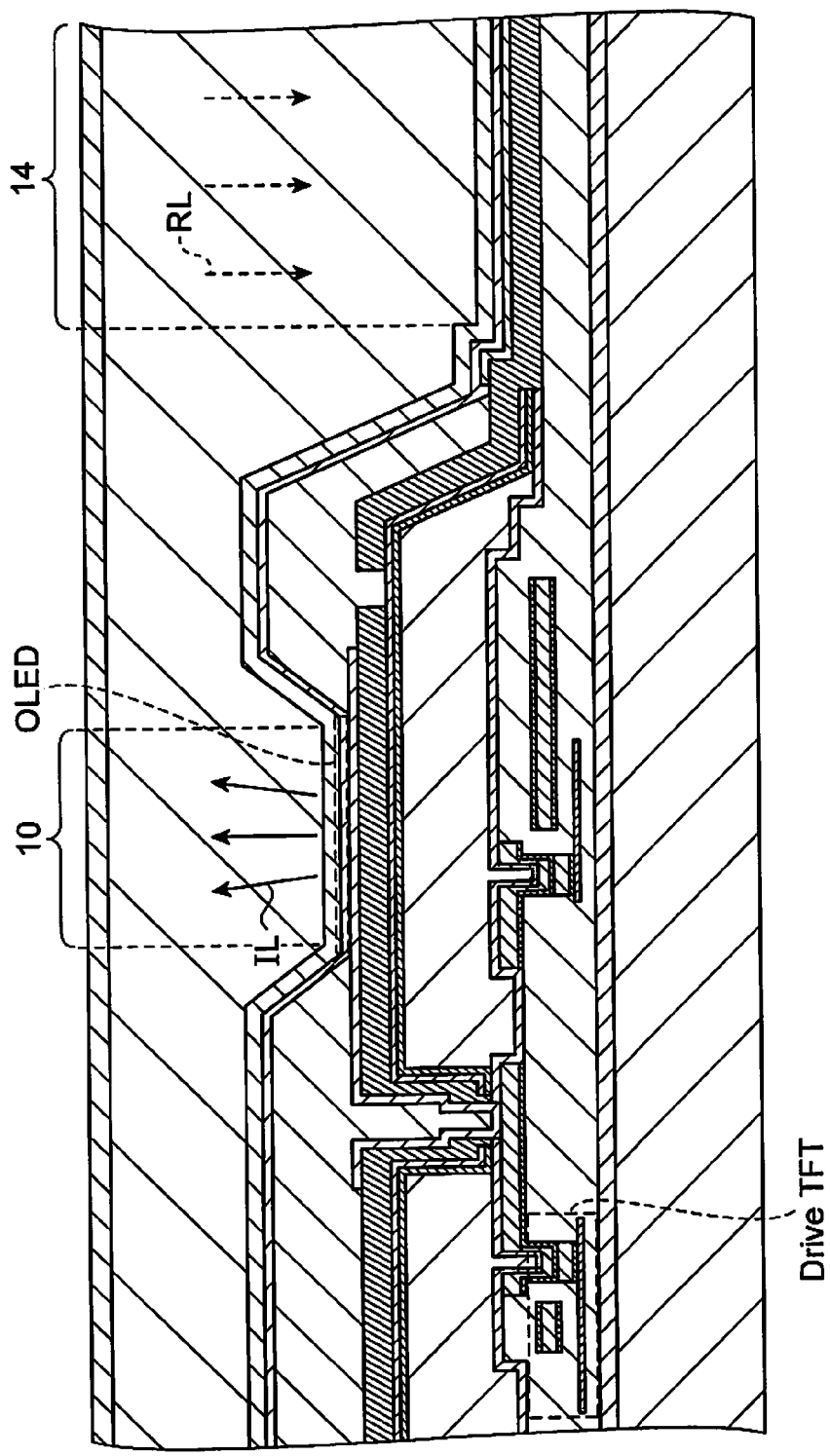
FIG. 4 is a diagram illustrating a part of a cross-sectional structure of the illumination device.

FIG. 4 is a diagram illustrating a part of the cross-sectional structure of the illumination device. It should be noted that in FIG. 4, the vertical and horizontal scale ratios are altered as appropriate in order to elucidate the description. For example, although a light-emitting portion 10 extends over almost the whole area of each sub-area, the length of the light-emitting portion 10 in the horizontal direction is reduced in FIG. 4 for the sake of clarity. Also, a part of the drive transistor Drive TFT is shown as a part of the control circuit.

As shown in FIG. 4, the control circuit is disposed in a different layer from the light-emitting portion 10. That is to say, the light-emitting portions 10 are formed in a layer that is situated above the control circuit, which includes the drive transistor Drive TFT and the like, in such a manner that the control circuit is embedded. On the other hand, the control circuit is not formed in the transmitting portions 14, and the transmitting portions 14 are composed of a transparent material.

Measuring Method

Next, a measuring method of the optical device 1 will be described with reference to FIG. 2.

To measure the subject F using the optical device 1, it is preferable to grasp an overall picture first, then cause light to be emitted locally from only a necessary portion, and thereby obtain more detailed information. In order to grasp an overall picture first, all of the light-emitting portions 10 of the illumination device 100 are caused to emit light, and an image of the overall picture is acquired by the measurement device 200. Next, in order to obtain a high-quality image having a high S/N ratio, the illumination device 100 is caused to locally emit light, and a detailed image is acquired using the reflected light RL.

In measurement using the local light emission, for example, in the case where light is to be received by the first light-receiving portion 201, the first light-emitting portion 101, the second light-emitting portion 102, the third light-emitting portion 103, and the fourth light-emitting portion 104 are controlled by the first control portion, the second control portion, the third control portion, and the fourth control portion so as to emit light. That is to say, when measurement is to be performed by the first light-receiving portion 201, light can be emitted from the first light-emitting portion 101, the second light-emitting portion 102, the third light-emitting portion 103, and the fourth light-emitting portion 104, which surround the first light-receiving portion 201 when viewed from above, so that the optical device 1 can reduce the noise light and achieve a high S/N ratio.

Electronic Device

The above-described optical device 1 can be adapted for various biometric sensors such as a vein sensor and a fingerprint sensor. If a vein sensor is provided with the above-described optical device 1, a sharper vein image having a high S/N ratio can be obtained. Also, if a fingerprint sensor is provided with the above-described optical device 1, a sharper fingerprint image having a high S/N ratio can be obtained. In addition to these, the optical device 1 according to this embodiment can be applied to electronic devices such as a digital camera, an image sensor, and a scanner. In cases where the optical device 1 is adapted for a vein sensor or a fingerprint sensor, a contact sensor may also be provided in the optical device 1 so that the optical device 1 is automatically activated when the subject touches the optical device 1.

Embodiment 2

Figure 5:
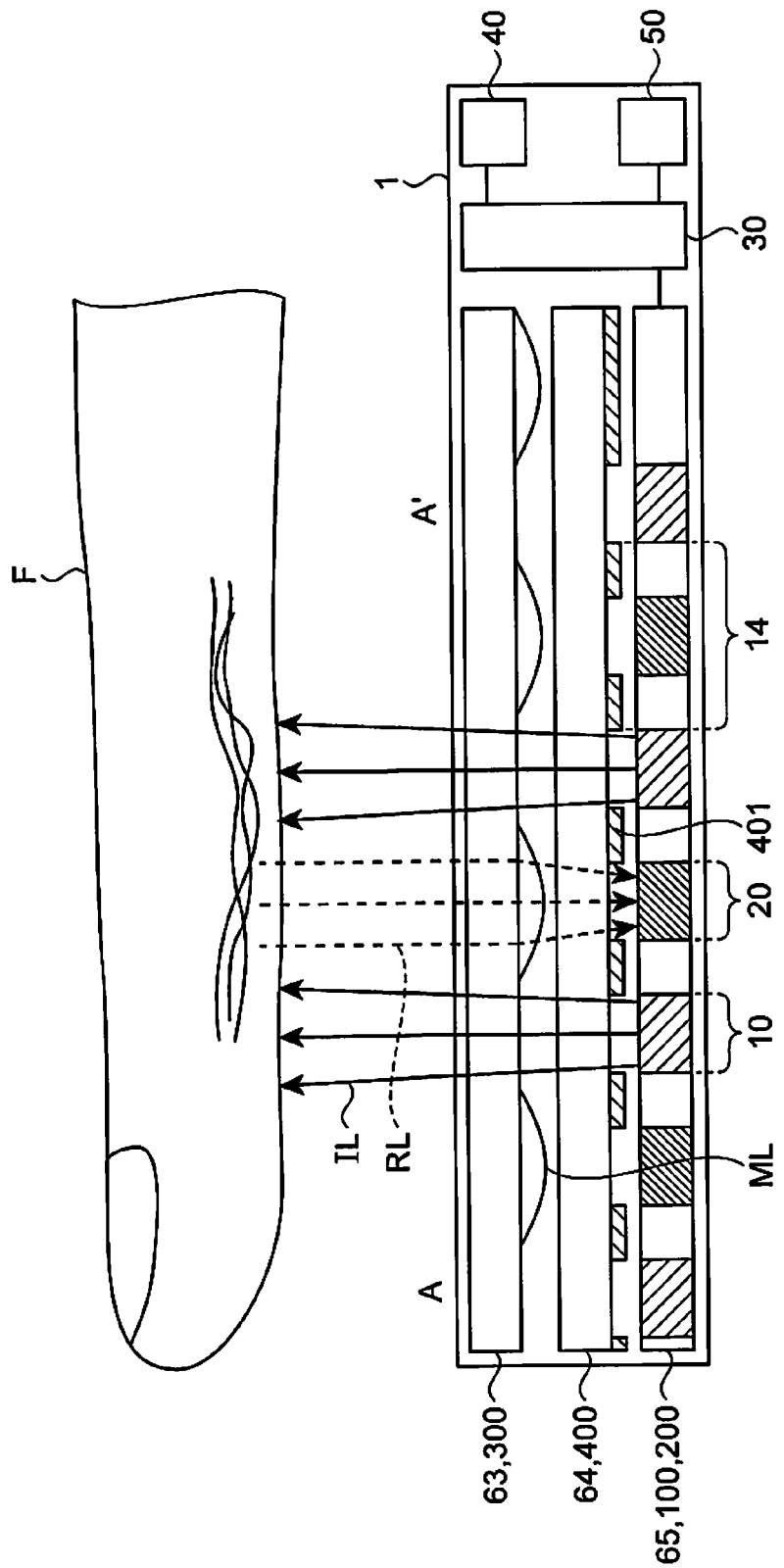
FIG. 5 is a cross-sectional view of an optical device according to Embodiment 2.

Form in which Illumination Device and Measurement Device are Formed in the Same Substrate FIG. 5 is a cross-sectional view of an optical device according to this embodiment. In FIG. 5, by way of example, a cross section taken along line A-A' in the plan view shown in FIG. 2 is schematically shown. Next, referring to FIG. 5, the optical device according to this embodiment will be described. It should be noted that the same components as those in Embodiment 1 are denoted by the same reference numerals, and redundant descriptions thereof are omitted. In Embodiment 1, the illumination device 100 is formed in the first substrate 61, and the measurement device 200 is formed in the second substrate 62. This embodiment differs from Embodiment 1 in that both the illumination device 100 and the measurement device 200 are formed in a fifth substrate 65. Otherwise, this embodiment is similar to Embodiment 1.

The control circuit is formed using thin film elements such as thin film transistors. The light-receiving portions 20 can also be formed using photodiodes, thin film transistors, and the like, and therefore both the light-emitting portions 10 having the control circuit and the light-receiving portions 20 may be formed in the fifth substrate 65 using thin film elements. That is to say, the control circuit and the light-receiving portions 20 may be formed in the same layer. In this case, since both the illumination device 100 having the light-emitting portions 10 and the measurement device 200 having the light-receiving portions 20 are formed in the fifth substrate 65, more integration is achieved, and specifically, the thickness of the optical device 1 can be reduced.

Embodiment 3

Form in which Control Circuit can be Recombined

Next, an optical device according to this embodiment will be described. It should be noted that the same components as those in Embodiments 1 and 2 are denoted by the same reference numerals, and redundant descriptions thereof are omitted. In Embodiment 1, the unit areas UA are fixed. This embodiment differs from Embodiment 1 in that the unit areas UA are variable.

In this embodiment, the control circuit can be recombined. Therefore, for example, in the case where light is to be received by the second light-receiving portion 202, a control circuit is constituted by the second control portion, the fourth control portion, the fifth control portion, and the sixth control portion, and the second light-emitting portion 102, the fourth light-emitting portion 104, the fifth light-emitting portion 105, and the sixth light-emitting portion 106 can be controlled by this control circuit so as to emit light. In this manner, the second control portion and the fourth control portion are used in both the case where light is to be received by the first light-receiving portion 201 and the case where light is to be received by the second light-receiving portion 202, so that the circuit size can be reduced, and thus the proportion of the area of the transmitting portions 14 can be increased. The increase in the area of the transmitting portions 14 can improve the sensitivity of the optical device 1. Moreover, with respect to both of the first light-receiving portion 201 and the second light-receiving portion 202, light is emitted from around the light-receiving portion, so that the optical states of the first light-receiving portion 201 and the second light-receiving portion 202 can be made equal to each other, and thus uniform imaging can be realized.

Alternatively, in the case where light is to be received by the third light-receiving portion 203, a control circuit is constituted by the third control portion, the fourth control portion, the seventh control portion, and the eighth control portion, and the third light-emitting portion 103, the fourth light-emitting portion 104, the seventh light-emitting portion 107, and the eighth light-emitting portion 108 can be controlled by this control circuit so as to emit light. In this manner, the third control portion and the fourth control portion are used in both the case where light is to be received by the first light-receiving portion 201 and the case where light is to be received by the third light-receiving portion 203, so that the circuit size can be reduced, and thus the proportion of the area of the transmitting portions 14 can be increased. The increase in the area of the transmitting portions 14 can improve the sensitivity of the optical device 1. Moreover, with respect to both of the first light-receiving portion 201 and the third light-receiving portion 203, light is emitted from around the light-receiving portion, so that the optical states of the first light-receiving portion 201 and the third light-receiving portion 203 can be made equal to each other, and thus uniform imaging can be realized.

Embodiment 4

Form in which Control Portion is Shared

Next, an optical device according to this embodiment will be described with reference to FIG. 2. It should be noted that the same components as those in Embodiments 1 to 3 are denoted by the same reference numerals, and redundant descriptions thereof are omitted. In Embodiment 1, each of the functionally demarcated control portions constitutes a part of one control circuit. This embodiment differs from Embodiment 1 in that some of the control portions are shared by a plurality of control circuits. Otherwise, this embodiment is similar to Embodiment 1.

In the case where imaging is to be performed using the first light-receiving portion 201 and the second light-receiving portion 202, the first light-emitting portion 101, the second light-emitting portion 102, the third light-emitting portion 103, and the fourth light-emitting portion 104 that surround the first light-receiving portion 201 are caused to emit light, and also the second light-emitting portion 102, the fourth light-emitting portion 104, the fifth light-emitting portion 105, and the sixth light-emitting portion 106 that surround the second light-receiving portion 202 are caused to emit light. At this time, the first light-emitting portion 101, the second light-emitting portion 102, the third light-emitting portion 103, and the fourth light-emitting portion 104 are caused to emit light by a control circuit constituted by the first control portion, the second control portion, the third control portion, and the fourth control portion, while the second light-emitting portion 102, the fourth light-emitting portion 104, the fifth light-emitting portion 105, and the sixth light-emitting portion 106 are caused to emit light by a control circuit constituted by the second control portion, the fourth control portion, the fifth control portion, and the sixth control portion. At this time, the second control portion and the fourth control portion are shared by the two control circuits.

Also, in the case where imaging is to be performed using the first light-receiving portion 201 and the third light-receiving portion 203, the first light-emitting portion 101, the second light-emitting portion 102, the third light-emitting portion 103, and the fourth light-emitting portion 104 that surround the first light-receiving portion 201 are caused to emit light, and also the third light-emitting portion 103, the fourth light-emitting portion 104, the seventh light-emitting portion 107, and the eighth light-emitting portion 108 that surround the third light-receiving portion 203 are caused to emit light. At this time, the first light-emitting portion 101, the second light-emitting portion 102, the third light-emitting portion 103, and the fourth light-emitting portion 104 are caused to emit light by the control circuit constituted by the first control portion, the second control portion, the third control portion, and the fourth control portion, while the third light-emitting portion 103, the fourth light-emitting portion 104, the seventh light-emitting portion 107, and the eighth light-emitting portion 108 are caused to emit light by a control circuit constituted by the third control portion, the fourth control portion, the seventh control portion, and the eighth control portion. At this time, the third control portion and the fourth control portion are shared by the two control circuits.

Also, in the case where imaging is to be performed using the first light-receiving portion 201, the second light-receiving portion 202, and the third light-receiving portion 203, the first light-emitting portion 101, the second light-emitting portion 102, the third light-emitting portion 103, and the fourth light-emitting portion 104 that surround the first light-receiving portion 201 are caused to emit light, the second light-emitting portion 102, the fourth light-emitting portion 104, the fifth light-emitting portion 105, and the sixth light-emitting portion 106 that surround the second light-receiving portion 202 are caused to emit light, and furthermore, the third light-emitting portion 103, the fourth light-emitting portion 104, the seventh light-emitting portion 107, and the eighth light-emitting portion 108 that surround the third light-receiving portion 203 are caused to emit light. At this time, the first light-emitting portion 101, the second light-emitting portion 102, the third light-emitting portion 103, and the fourth light-emitting portion 104 are caused to emit light by the control circuit constituted by the first control portion, the second control portion, the third control portion, and the fourth control portion, the second light-emitting portion 102, the fourth light-emitting portion 104, the fifth light-emitting portion 105, and the sixth light-emitting portion 106 are caused to emit light by the control circuit constituted by the second control portion, the fourth control portion, the fifth control portion, and the sixth control portion, and the third light-emitting portion 103, the fourth light-emitting portion 104, the seventh light-emitting portion 107, and the eighth light-emitting portion 108 are caused to emit light by the control circuit constituted by the third control portion, the fourth control portion, the seventh control portion, and the eighth control portion. At this time, the fourth control portion is shared by the three control circuits.

Also, in the case where imaging is to be performed using the first light-receiving portion 201, the second light-receiving portion 202, the third light-receiving portion 203, and the fourth light-receiving portion 204, the first light-emitting portion 101, the second light-emitting portion 102, the third light-emitting portion 103, and the fourth light-emitting portion 104, which surround the first light-receiving portion 201, are caused to emit light, the second light-emitting portion 102, the fourth light-emitting portion 104, the fifth light-emitting portion 105, and the sixth light-emitting portion 106, which surround the second light-receiving portion 202, are caused to emit light, the third light-emitting portion 103, the fourth light-emitting portion 104, the seventh light-emitting portion 107, and the eighth light-emitting portion 108, which surround the third light-receiving portion 203, are caused to emit light, and furthermore, the fourth light-emitting portion 104, the fifth light-emitting portion 105, the seventh light-emitting portion 107, and the ninth light-emitting portion 109, which surround the fourth light-receiving portion 204, are caused to emit light. At this time, the first light-emitting portion 101, the second light-emitting portion 102, the third light-emitting portion 103, and the fourth light-emitting portion 104 are caused to emit light by the control circuit constituted by the first control portion, the second control portion, the third control portion, and the fourth control portion, the second light-emitting portion 102, the fourth light-emitting portion 104, the fifth light-emitting portion 105, and the sixth light-emitting portion 106 are caused to emit light by the control circuit constituted by the second control portion, the fourth control portion, the fifth control portion, and the sixth control portion; the third light-emitting portion 103, the fourth light-emitting portion 104, the seventh light-emitting portion 107, and the eighth light-emitting portion 108 are caused to emit light by the control circuit constituted by the third control portion, the fourth control portion, the seventh control portion, and the eighth control portion, and the fourth light-emitting portion 104, the fifth light-emitting portion 105, the seventh light-emitting portion 107, and the ninth light-emitting portion 109 are caused to emit light by a control circuit constituted by the fourth control portion, the fifth control portion, the seventh control portion, and the ninth control portion. At this time, the fourth control portion is shared by the four control circuits.

Embodiment 5

Form in which Light-Emitting Portions are Individually Controlled

Figure 6:
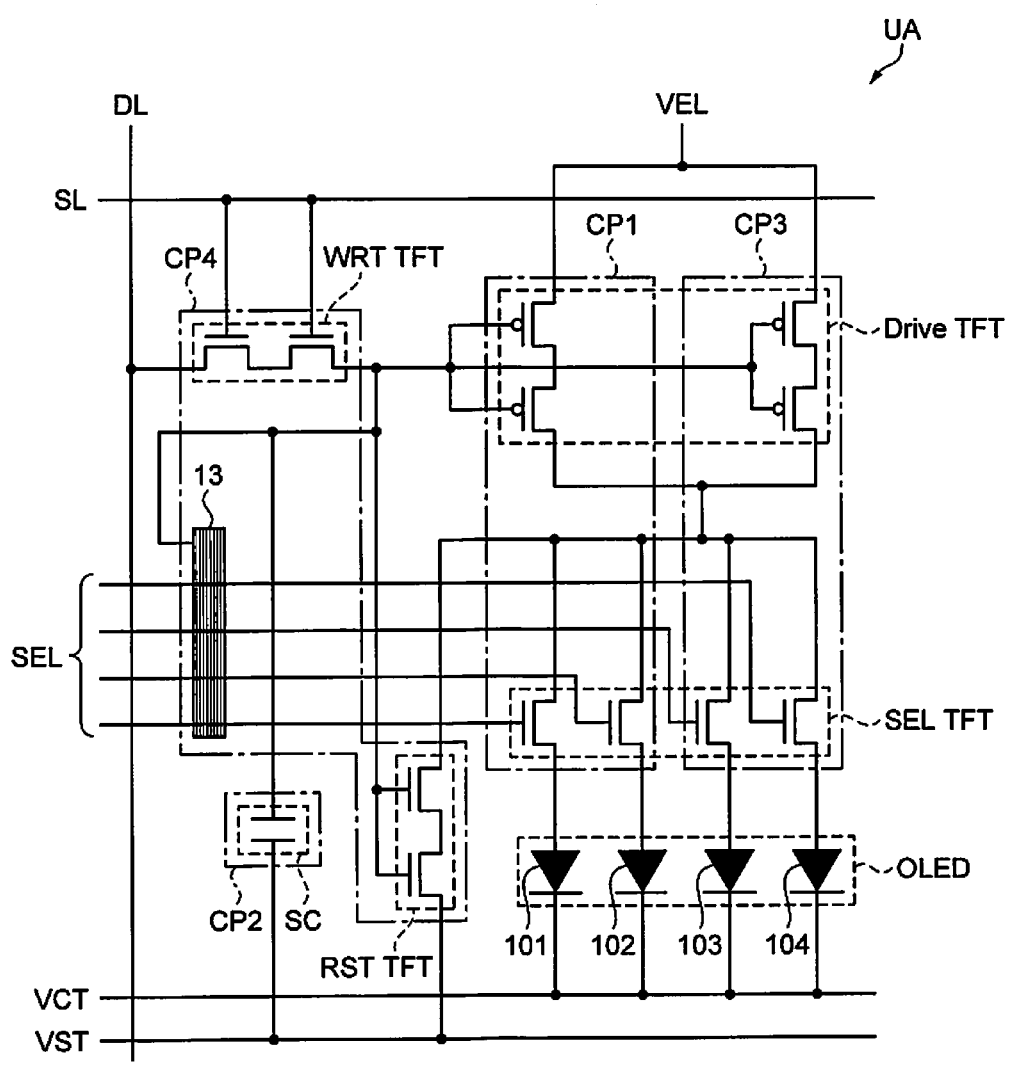
FIG. 6 is a diagram illustrating a circuit configuration in a unit area of an illumination device according to Embodiment 5.

FIG. 6 is a diagram illustrating a circuit configuration in a unit area of an illumination device according to this embodiment. Next, an optical device according to this embodiment will be described with reference to FIG. 6. It should be noted that the same components as those in Embodiments 1 to 4 are denoted by the same reference numerals, and redundant descriptions thereof are omitted. In Embodiments 1 to 4, the first light-emitting portion 101, the second light-emitting portion 102, the third light-emitting portion 103, and the fourth light-emitting portion 104 are collectively controlled. This embodiment differs from Embodiments 1 to 4 in that light emission and non-light emission of the light-emitting portions 10 are controlled individually. Otherwise, this embodiment is similar to Embodiments 1 to 4.

In FIG. 6, by way of example, the predetermined area including the first light-emitting portion 101, the second light-emitting portion 102, the third light-emitting portion 103, and the fourth light-emitting portion 104 is shown as the unit area UA.

In each unit area UA, the scan line SL and the data line DL are routed, and the unit area UA is formed at an intersection of these lines. The anode power supply line VEL, the cathode power supply line VCT, the fixed potential line VST, and selection signal lines SEL are further routed in each unit area UA. A control circuit is formed in each unit area UA. The control circuit includes the write transistor WRT TFT, the storage capacitor SC, the drive transistor Drive TFT, the reset transistor RST TFT, a selecting portion 13, selecting transistors SEL TFT, and the organic EL element OLED. In this embodiment, the write transistor WRT TFT, the reset transistor RST TFT, and the selecting transistors SEL TFT are N-type thin film transistors, and the drive transistor Drive TFT is a P-type thin film transistor.

A first control portion CP1, a second control portion CP2, a third control portion CP3, and a fourth control portion CP4 that constitute the control circuit have different functions, and the first light-emitting portion 101, the second light-emitting portion 102, the third light-emitting portion 103, and the fourth light-emitting portion 104 are individually controlled by the control circuit. In a specific example, the first control portion CP1 of the control circuit includes a part of the drive transistor Drive TFT and a part of the selecting transistors SEL TFT, and the second control portion CP2 of the control circuit includes the storage capacitor SC. Furthermore, the third control portion CP3 of the control circuit includes the other part of the drive transistor Drive TFT and the other part of the selecting transistors SEL TFT. A part of the drive transistor Drive TFT and a part of the selecting transistors SEL TFT are formed in the first control portion CP1, and the other parts of those transistors are formed in the third control portion CP3. The fourth control portion CP4 of the control circuit includes the write transistor WRT TFT, the reset transistor RST TFT, and the selecting portion 13. The organic EL element OLED constitutes the first light-emitting portion 101, the second light-emitting portion 102, the third light-emitting portion 103, and the fourth light-emitting portion 104. As shown in FIG. 6, even if the control circuit has a complicated configuration, the control circuit can be configured within the unit area UA (predetermined area) by functionally dividing the control circuit into the four control portions.

The gate of the write transistor WRT TFT is electrically connected to the scan line SL, while one of the source and the drain thereof is electrically connected to the data line DL and the other is electrically connected to one of the electrodes of the storage capacitor SC, the gate of the drive transistor Drive TFT, the gate of the reset transistor RST TFT, and an input of the selecting portion 13. The other electrode of the storage capacitor SC is electrically connected to the fixed potential line VST. One of the source and the drain of the drive transistor Drive TFT (in this embodiment, the source of the P-type thin film transistor) is electrically connected to the anode power supply line VEL, and the other is electrically connected to one of the source and the drain of each of the selecting transistors SEL TFT (in this embodiment, the drain of the N-type thin film transistor) and one of the source and the drain of the reset transistor RST TFT (in this embodiment, the drain of the N-type thin film transistor). The other of the source and the drain of the reset transistor RST TFT (in this embodiment, the source of the N-type thin film transistor) is electrically connected to the fixed potential line VST. The other of the source and the drain of each of the selecting transistors SEL TFT (in this embodiment, the source of the N-type thin film transistor) is electrically connected to the anode of the organic EL element OLED, and the cathode of the organic EL element OLED is electrically connected to the cathode power supply line VCT. Outputs of the selection signal lines SEL and the write transistor WRT TFT are electrically connected to the input of the selecting portion 13, and four outputs from the selecting portion 13 are electrically connected to the respective gates of the selecting transistors SEL TFT. Dual transistors in which transistors are electrically connected in series are used for the write transistor WRT TFT, the reset transistor RST TFT, and the drive transistor Drive TFT in order to suppress the leakage current from the transistors. Furthermore, in the drive transistor Drive TFT, the dual transistors are arranged in parallel in order to secure a certain amount of current.

The selecting portion 13 performs individual control of the four selecting transistors SEL TFT in accordance with data that is supplied via the write transistor WRT TFT and a selection signal that is supplied to the selection signal lines SEL. In this manner, the four light-emitting portions 10 are individually controlled.

It should be noted that the invention is not limited to the above-described embodiments, and various changes and modifications can be made to the above-described embodiments. Several variations will be described below.

Variation 1

Form in which Light Emission Wavelength is Different

In Embodiments 1 to 5, the first light-emitting portion 101, the second light-emitting portion 102, the third light-emitting portion 103, and the fourth light-emitting portion 104 emit light at the same wavelength. However, the light emission wavelength may also be changed for each light-emitting portion 10. For example, a configuration may also be adopted in which the first light-emitting portion 101 emits red light, the second light-emitting portion 102 emits green light, the third light-emitting portion 103 emits blue light, and the fourth light-emitting portion 104 emits white light.

Variation 2

Form in which N is Different

In Embodiments 1 to 4, N=4. However, N can be any value as long as N is an integer of 2 or more. For example, a configuration may also be adopted in which the unit area UA has a hexagonal shape, and N=6.

Variation 3

Form in which Front Light is Used Alone

In Embodiments 1 to 5, the illumination device 100 constitutes a part of the optical device 1. However, the illumination device 100 may also be used alone as a front light. Alternatively, the illumination device and the light controlling device may be used as a front light. In this case, the microlenses ML may be replaced by planar lenses. The front light can be used for a display device of cellular telephones, gaming devices, electronic paper, video cameras, digital still cameras, car navigation devices, and the like.

Application Example 1

An optical device according to this application example includes a first transmitting portion that is disposed at the center of a predetermined area in a first substrate, a light-receiving portion that receives light passing through the first transmitting portion, N light-emitting portions (N is an integer of 2 or more) that are disposed around the first transmitting portion in the predetermined area, and a control circuit that controls the light-emitting portions, wherein the control circuit is functionally divided into N control portions, namely, first to N-th control portions, and the N control portions are disposed in areas overlapping the N light-emitting portions, respectively, when viewed from above.

With this configuration, it is possible to cause light to be emitted from any location of the optical device when viewed from above. Therefore, it is possible to cause light to be emitted from only an optimum location that is suitable for imaging while turning off light from the other locations, so that the optical device can reduce noise light and achieve a high S/N ratio. Furthermore, since one control circuit controls the N light-emitting portions, the area of the control circuit can be reduced when compared with a case where one control circuit controls one light-emitting portion, and consequently, the proportion of the area of the transmitting portion can be increased. The increase in the area of the transmitting portion can improve the sensitivity of the optical device.

Application Example 2

It is preferable that the optical device according to Application Example 1 is configured such that the light-receiving portion is disposed in an area overlapping the first transmitting portion when the first substrate is viewed from above, and the control circuit and the light-receiving portion are disposed in the same layer in the first substrate.

With this configuration, since an illumination device having the light-emitting portions and a measurement device having the light-receiving portion are formed in the first substrate, more integration is achieved, and specifically, the thickness of the optical device can be reduced.

Application Example 3

It is preferable that the optical device according to Application Example 1 is configured such that the first substrate is a glass substrate, the light-receiving portion is disposed in a second substrate that is different from the first substrate, and the first substrate and the second substrate are fixed so that the first transmitting portion and the light-receiving portion overlap each other when viewed from above.

With this configuration, the illumination device having the light-emitting portions is formed in the first substrate, and the measurement device having the light-receiving portion is formed in the second substrate, so that the manufacturing process is facilitated, and the yield can be improved.

Application Example 4

An optical device according to this application example includes a first transmitting portion that is disposed at the center of a predetermined area in a first substrate, a first light-receiving portion that receives light passing through the first transmitting portion, a light-emitting portion that is disposed around the first transmitting portion, and a control circuit that is disposed in a different layer from the light-emitting portion and controls the light-emitting portion, wherein the light-emitting portion has a first light-emitting portion that is disposed in a first area, a second light-emitting portion that is disposed in a second area, a third light-emitting portion that is disposed in a third area, and a fourth light-emitting portion that is disposed in a fourth area, the third area is symmetrical to the second area with respect to the first transmitting portion, the fourth area is symmetrical to the first area with respect to the first transmitting portion, the control circuit has a first control portion, a second control portion, a third control portion, and a fourth control portion, and in a state in which the first substrate is viewed from above, the first control portion is disposed at a position overlapping the first area, the second control portion is disposed at a position overlapping the second area, the third control portion is disposed at a position overlapping the third area, and the fourth control portion is disposed at a position overlapping the fourth area.

With this configuration, it is possible to cause light to be emitted from any location of the optical device when viewed from above. Therefore, it is possible to cause light to be emitted from only an optimum location that is suitable for imaging while turning off light from the other locations, so that the optical device can reduce noise light and achieve a high S/N ratio. Furthermore, since one control circuit controls the four light-emitting portions, the area of the control circuit can be reduced when compared with a case where one control circuit controls one light-emitting portion, and consequently, the proportion of the area of the transmitting portion can be increased. The increase in the area of the transmitting portion can improve the sensitivity of the optical device. Moreover, when measurement is performed by the first light-receiving portion, the first light-emitting portion, the second light-emitting portion, the third light-emitting portion, and the fourth light-emitting portion that surround the first light-receiving portion when viewed from above can be caused to emit light, and thus the optical device can reduce noise light and achieve a high S/N ratio.

Application Example 5

It is preferable that the optical device according to Application Example 4 is configured such that the first control portion, the second control portion, the third control portion, and the fourth control portion have different functions, and each of the first light-emitting portion, the second light-emitting portion, the third light-emitting portion, and the fourth light-emitting portion is controlled by the control circuit.

With this configuration, even if the control circuit has a complicated configuration, the control circuit can be configured within the predetermined area by functionally dividing the control circuit into the four control portions.

Application Example 6

It is preferable that the optical device according to Application Example 4 or 5 is configured such that the optical device further includes a second transmitting portion that is contiguous with the second area and the fourth area and a second light-receiving portion that receives light transmitted through the second transmitting portion, wherein a fifth area and a sixth area that are symmetrical to the second area and the fourth area, respectively, with respect to the second transmitting portion are provided around the second transmitting portion, and in a state in which the first substrate is viewed from above, a fifth control portion having a function equivalent to that of the third control portion is provided at a position overlapping the fifth area, and a sixth control portion having a function equivalent to that of the first control portion is provided at a position overlapping the sixth area.

With this configuration, it is possible to cause light to be emitted from any location of the optical device when viewed from above. Therefore, it is possible to cause light to be emitted from only an optimum location that is suitable for imaging while turning off light from the other locations, so that the optical device can reduce noise light and achieve a high S/N ratio. Furthermore, since one control circuit controls the four light-emitting portions, the area of the control circuit can be reduced when compared with a case where one control circuit controls one light-emitting portion, and consequently, the proportion of the area of the transmitting portion can be increased. The increase in the area of the transmitting portion can improve the sensitivity of the optical device. Moreover, the second control portion and the fourth control portion are used in both the case where light is to be received by the first light-receiving portion and the case where light is to be received by the second light-receiving portion, so that the circuit size can be reduced, and thus the proportion of the area of the transmitting portion can be increased. The increase in the area of the transmitting portion can improve the sensitivity of the optical device. Moreover, with respect to both of the first light-receiving portion and the second light-receiving portion, light is emitted from around the light-receiving portion, so that the optical states of the first light-receiving portion and the second light-receiving portion can be made equal to each other, and thus uniform imaging can be realized.

Application Example 7

It is preferable that the optical device according to Application Example 6 is configured such that the predetermined area has a shape that is defined by the first transmitting portion, the first area, the second area, the third area, and the fourth area, and a shape of an area that is defined by the second transmitting portion, the second area, the fourth area, the fifth area, and the sixth area is the same as the shape of the predetermined area.

With this configuration, it is possible to cause light to be emitted from any location of the optical device when viewed from above. Therefore, it is possible to cause light to be emitted from only an optimum location that is suitable for imaging while turning off light from the other locations, so that the optical device can reduce noise light and achieve a high S/N ratio. Furthermore, since one control circuit controls the four light-emitting portions, the area of the control circuit can be reduced when compared with a case where one control circuit controls one light-emitting portion, and consequently, the proportion of the area of the transmitting portion can be increased. The increase in the area of the transmitting portion can improve the sensitivity of the optical device.

Application Example 8

It is preferable that the optical device according to Application Example 6 or 7 is configured such that if light is to be received by the first light-receiving portion, the first light-emitting portion, the second light-emitting portion, the third light-emitting portion, and the fourth light-emitting portion are controlled by the first control portion, the second control portion, the third control portion, and the fourth control portion so as to emit light, and if light is to be received by the second light-receiving portion, the second light-emitting portion, the fourth light-emitting portion, a fifth light-emitting portion, and a sixth light-emitting portion are controlled by the second control portion, the fourth control portion, the fifth control portion, and the sixth control portion so as to emit light.

With this configuration, the second control portion and the fourth control portion are used in both the case where light is to be received by the first light-receiving portion and the case where light is to be received by the second light-receiving portion, so that the circuit size can be reduced, and thus the proportion of the area of the transmitting portion can be increased. The increase in the area of the transmitting portion can improve the sensitivity of the optical device. Moreover, with respect to both of the first light-receiving portion and the second light-receiving portion, light is emitted from around the light-receiving portion, so that the optical states of the first light-receiving portion and the second light-receiving portion can be made equal to each other, and thus uniform imaging can be realized.

Application Example 9

It is preferable that the optical device according to any one of Application Examples 4 to 8 is configured such that the optical device further includes a third transmitting portion that is contiguous with the third area and the fourth area and a third light-receiving portion that receives light passing through the third transmitting portion, wherein a seventh area and an eighth area that are symmetrical to the third area and the fourth area, respectively, are provided around the third transmitting portion, and in a state in which the first substrate is viewed from above, a seventh control portion having a function equivalent to that of the second control portion is provided at a position overlapping the seventh area, and an eighth control portion having a function equivalent to that of the first control portion is provided at a position overlapping the eighth area.

With this configuration, it is possible to cause light to be emitted from any location of the optical device when viewed from above. Therefore, it is possible to cause light to be emitted from only an optimum location that is suitable for imaging while turning off light from the other locations, so that the optical device can reduce noise light and achieve a high S/N ratio. Furthermore, since one control circuit controls the four light-emitting portions, the area of the control circuit can be reduced when compared with a case where one control circuit controls one light-emitting portion, and consequently, the proportion of the area of the transmitting portion can be increased. The increase in the area of the transmitting portion can improve the sensitivity of the optical device. Moreover, the third control portion and the fourth control portion are used in both the case where light is to be received by the first light-receiving portion and the case where light is to be received by the third light-receiving portion, so that the circuit size can be reduced, and thus the proportion of the area of the transmitting portion can be increased. The increase in the area of the transmitting portion can improve the sensitivity of the optical device. Moreover, with respect to both of the first light-receiving portion and the third light-receiving portion, light is emitted from around the light-receiving portion, so that the optical states of the first light-receiving portion and the third light-receiving portion can be made equal to each other, and thus uniform imaging can be realized.

Application Example 10

It is preferable that the optical device according to Application Example 9 is configured such that a shape of an area that is defined by the third transmitting portion, the third area, the fourth area, the seventh area, and the eighth area is the same as the shape of the predetermined area.

With this configuration, it is possible to cause light to be emitted from any location of the optical device when viewed from above. Therefore, it is possible to cause light to be emitted from only an optimum location that is suitable for imaging while turning off light from the other locations, so that the optical device can reduce noise light and achieve a high S/N ratio. Furthermore, since one control circuit controls the four light-emitting portions, the area of the control circuit can be reduced when compared with a case where one control circuit controls one light-emitting portion, and consequently, the proportion of the area of the transmitting portion can be increased. The increase in the area of the transmitting portion can improve the sensitivity of the optical device.

Application Example 11

It is preferable that the optical device according to Application Example 9 or 10 is configured such that if light is to be received by the third light-receiving portion, the third light-emitting portion, the fourth light-emitting portion, a seventh light-emitting portion, and an eighth light-emitting portion are controlled by the third control portion, the fourth control portion, the seventh control portion, and the eighth control portion so as to emit light.

With this configuration, the third control portion and the fourth control portion are used in both the case where light is to be received by the first light-receiving portion and the case where light is to be received by the third light-receiving portion, so that the circuit size can be reduced, and thus the proportion of the area of the transmitting portion can be increased. The increase in the area of the transmitting portion can improve the sensitivity of the optical device. Moreover, with respect to both of the first light-receiving portion and the third light-receiving portion, light is emitted from around the light-receiving portion, so that the optical states of the first light-receiving portion and the third light-receiving portion can be made equal to each other, and thus uniform imaging can be realized.

Application Example 12

An optical device according to this application example includes a first transmitting portion that is disposed at the center of a predetermined area in a first substrate, N light-emitting portions (N is an integer of 2 or more) that are disposed around the first transmitting portion in the predetermined area, and a control circuit that controls the light-emitting portions, wherein the control circuit is functionally divided into N control portions, namely, first to N-th control portions, and the N control portions are disposed in areas overlapping the N light-emitting portions, respectively, when viewed from above.

With this configuration, it is possible to use the above-described optical device as an illumination device and cause light to be emitted from any location of that illumination device when viewed from above. Therefore, it is possible to cause light to be emitted from only a location at which illumination is required while turning off light from the other locations, so that the power consumption of the illumination device can be suppressed. Furthermore, since one control circuit controls the N light-emitting portions, the area of the control circuit can be reduced when compared with a case where one control circuit controls one light-emitting portion, and consequently, the proportion of the area of the transmitting portion can be increased. The increase in the area of the transmitting portion improves the overall transparency of the illumination device, and thus, a bright and high-visibility front light can be obtained.

Application Example 13

An optical device according to this application example includes a first transmitting portion that is disposed at the center of a predetermined area in a first substrate, a light-emitting portion that is disposed around the first transmitting portion, and a control circuit that is disposed in a different layer from the light-emitting portion and controls the light-emitting portion, wherein the light-emitting portion has a first light-emitting portion that is disposed in a first area, a second light-emitting portion that is disposed in a second area, a third light-emitting portion that is disposed in a third area, and a fourth light-emitting portion that is disposed in a fourth area, the third area is symmetrical to the second area with respect to the first transmitting portion, the fourth area is symmetrical to the first area with respect to the first transmitting portion, the control circuit has a first control portion, a second control portion, a third control portion, and a fourth control portion, and in a state in which the first substrate is viewed from above, the first control portion is disposed at a position overlapping the first area, the second control portion is disposed at a position overlapping the second area, the third control portion is disposed at a position overlapping the third area, and the fourth control portion is disposed at a position overlapping the fourth area.

With this configuration, it is possible to use the above-described optical device as an illumination device and cause light to be emitted from any location of the illumination device when viewed from above. Therefore, it is possible to cause light to be emitted from only a location at which illumination is required while turning off light from the other locations, and thus the power consumption of the illumination device can be suppressed. Furthermore, since one control circuit controls the four light-emitting portions, the area of the control circuit can be reduced when compared with a case where one control circuit controls one light-emitting portion, and consequently, the proportion of the area of the transmitting portion can be increased. The increase in the area of the transmitting portion improves the overall transparency of the illumination device, so that a bright and high-visibility front light can be obtained.

What is claimed is:

1. An optical device, comprising:
a first substrate;
a second substrate;
a first transmitting portion disposed in the first substrate;
N light-emitting portions disposed in the first substrate, the N being an integer of 2 or more;
a light-receiving portion configured to receive light passing through the first transmitting portion and disposed in the second substrate; and
a control circuit that controls the N light-emitting portions, the control circuit including a single selecting portion that controls the N light-emitting portions individually, the single selecting portion overlapping only one of the N light-emitting portions as viewed from above.

2. The optical device according to claim 1, wherein
a wavelength of light that is emitted from at least one light-emitting portion among the N light-emitting portions is different from a wavelength of light that is emitted from a different light-emitting portion that is different from the at least one light-emitting portion among the N light-emitting portions.

3. The optical device according to claim 1, wherein
a wavelength of light that is emitted from at least one light-emitting portion among the N light-emitting portions is greater than or equal to 750 nm and smaller than or equal to 3000 nm.

4. The optical device according to claim 1, wherein
wavelengths of light emitted from the N light-emitting portions are different from each other.

5. The optical device according to claim 1, wherein
the N light-emitting portions are disposed around the first transmitting portion.

6. The optical device according to claim 2, wherein
wavelengths of light emitted from the N light-emitting portions are different from each other.

7. The optical device according to claim 3, wherein
wavelengths of light emitted from the N light-emitting portions are different from each other.

* * * * *